United States Patent [19]
Yoshizawa et al.

[11] Patent Number: 5,583,076
[45] Date of Patent: Dec. 10, 1996

[54] METHOD FOR MANUFACTURING A SEMICONDUCTOR PHOTO-SENSOR

[75] Inventors: Tetsuo Yoshizawa, Yokohama; Akio Mihara; Hiromichi Yamashita, both of Hiratsuka; Ichiro Ohnuki, Tokyo; Yasuo Suda, Yokohama; Keiji Ohtaka, Tokyo; Toshiaki Sato; Taichi Sugimoto, both of Sagamihara, all of Japan

[73] Assignee: Canon Kabushiki Kaisha, Tokyo, Japan

[21] Appl. No.: 472,110

[22] Filed: Jun. 7, 1995

Related U.S. Application Data

[62] Division of Ser. No. 415,581, Apr. 3, 1995, which is a continuation of Ser. No. 253,204, Jun. 2, 1994, abandoned, which is a continuation of Ser. No. 965,569, Oct. 23, 1992, abandoned, which is a continuation of Ser. No. 825,768, Jan. 21, 1992, abandoned, which is a continuation of Ser. No. 646,459, Jan. 25, 1991, abandoned, which is a continuation of Ser. No. 396,825, Aug. 21, 1989, abandoned, which is a continuation of Ser. No. 72,737, Jul. 13, 1987, abandoned.

[30] Foreign Application Priority Data

Jul. 16, 1986 [JP] Japan ................... 61-166895
Jul. 16, 1986 [JP] Japan ................... 61-166896
Jan. 14, 1987 [JP] Japan ..................... 62-6899

[51] Int. Cl.⁶ ...................................... H01L 21/60
[52] U.S. Cl. ................. 437/211; 437/2; 437/3; 437/209; 437/216; 437/219; 437/223
[58] Field of Search ..................... 437/2, 3, 209, 437/211, 213, 216, 219, 220, 223, 224

[56] References Cited

U.S. PATENT DOCUMENTS

| | | |
|---|---|---|
| 4,203,792 | 5/1980 | Thompson ............................ 437/211 |
| 4,641,418 | 2/1987 | Meddles ............................... 437/219 |
| 4,644,384 | 2/1987 | Charoensakvirochana et al. ... 437/211 |
| 4,685,987 | 8/1987 | Fick ..................................... 156/247 |
| 4,769,344 | 9/1988 | Sakai et al. .......................... 437/216 |
| 4,822,550 | 4/1989 | Komathu ............................. 437/211 |
| 4,843,036 | 6/1989 | Schmidt et al. ......................... 437/2 |
| 5,102,828 | 4/1992 | Marchisi ............................. 437/216 |

*Primary Examiner*—Kevin M. Picardat
*Attorney, Agent, or Firm*—Fitzpatrick, Cella, Harper & Scinto

[57] ABSTRACT

In a method for manufacturing a semiconductor photo-sensor, an assembly including a photoelectric conversion element having a photoreceiving section, and a lead terminal having an inner lead connected to the photoelectric conversion element by a bonding wire is provided. A light transmitting member is also provided within the cavity spaced apart from the photoelectric conversion element and at a light-incident side of the photoelectric conversion element, the light transmitting member having an inner surface facing an upper surface of the photoelectric conversion element and an outer surface opposite the inner surface. The photoelectric conversion element, the inner lead and the bonding wire are sealed by introducing a light transmitting resin into the cavity so as to provide a relation $l < 2 \cdot (d_1 + d_2) \cdot \tan\theta_1$, wherein $l$ is a length of the photoreceiving section of the photoelectric conversion element, $d_1$ is a thickness of the light transmitting resin above the upper surface of the photoelectric conversion element, $d_2$ is a thickness of the light transmitting member, and $\theta_1$ is a total reflection angle of the outer surface of the light transmitting member.

7 Claims, 10 Drawing Sheets

METHOD FOR MANUFACTURING A SEMICONDUCTOR PHOTO-SENSOR

This application is a division of application Ser. No. 08/415,581 filed Apr. 3, 1995, which is a continuation of application Ser. No. 08/253,204 filed Jun. 2, 1994, now abandoned, which is a continuation of application Ser. No. 07/965,569 filed Oct. 23, 1992, now abandoned, which is a continuation of application Ser. No. 07/825,768 filed Jan. 21, 1992, now abandoned, which is a continuation of application Ser. No. 07/646,459 filed Jan. 25, 1991, now abandoned, which is a continuation of application Ser. No. 07/396,825 filed Aug. 21, 1989, now abandoned, which is a continuation of application Ser. No. 07/072,737 filed Jul. 13, 1987, now abandoned.

BACKGROUND OF THE INVENTION

1. Field of the Invention

The present invention relates to a semiconductor photo-sensor having a photo-electric conversion element for converting an incident light to an electrical signal sealed by light transmitting resin, and a method for manufacturing the same.

2. Related Background Art

A prior art photo-electric converter for converting an incident light beam to an electrical signal is shown in FIG. 1.

A photo-electric conversion element 1 is fixed on a photo-electric conversion element support member 2, fine metal wires 3 are wire-bonded at predetermined areas on the photo-electric conversion element 1 and lead terminals 2', and light transmitting resin 4 is molded to form an outer shape. Then, external leads 2" of the lead terminals 2' are cut to a desired length and bent to complete the semiconductor photo-sensor.

The above prior art semiconductor photo-sensor has the following problems.

(1) When a photo-sensing area of the photo-electric conversion element comprises a plurality (n) of photo-sensing cells, if light 6 having a uniform light flux on each of n photo-sensing cells of the photo-electric conversion element 1 is applied, electrical signals derived from the n photo-sensing cells should be of the same level, but they are, in actuality, not of the same level. When light is applied to one of n photo-sensing cells and no light is applied to other photo-sensing cells, an electrical signal which is larger than a dark current is produced by the photo-sensing cell to which the light is not applied.

(2) If there is a defect on the surface 9 of the light transmitting resin 4, an electrical signal from a photo-sensing cell in the vicinity of an area 10 on the photo-electric conversion element 1 to which the light passing through the defect reaches, is lowered.

Those problems are serious, particularly in a semiconductor photo-sensor for focussing a camera (AF sensor) which has a number of fine photo-sensing cells because the smaller the area per photo-sensing area is, the higher sensitivity is required. Accordingly, it is generally recognized that packaging by the light transmitting resin is inapplicable to the AF sensor.

In another prior art semiconductor photo-sensor, an infrared ray blocking filter is mounted on a light transmission surface of the light transmitting resin. In such a semiconductor photo-sensor, in addition to the above-mentioned problem that the electrical signals which exactly represent the incident light are not produced, the following manufacturing problem arises.

(1) When the light transmitting resin is molded, mold releasing agent may be deposited on the surface of the resin or a flow is formed during transfer of the mold. They are factors of impeding the light transmission and effect to the photo-characteristic of the photo-electric conversion element. Washing and polishing process to remove them are additionally required, which is a cause to increase a manufacturing cost.

(2) When the optical filter is bonded, liquid bonding material is used. Accordingly, it is difficult to improve a vertical positional precision. In order to improve a horizontal positional precision, mechanical or optical position detection is required. If it is done by a mechanical unit, it is complex and needs expensive investment.

(3) If an air bubble exists in the bonding material, it impedes the light transmission and effects to the photo-characteristic of the photo-electric conversion element. Accordingly, great care must paid in bonding the optical filter.

(4) As shown in FIG. 12, when the optical filter is a lens 29, the bonding surface of the light transmitting resin 4 is not planar. Accordingly, the light transmitting resin 4 may have an acute corner 30. In such a case, it is hard to release the mold and a crack may be produced in the resin. This lowers the manufacturing yield.

SUMMARY OF THE INVENTION

It is an object of the present invention to provide a semiconductor photo-sensor having an improved characteristic which overcomes the problems encountered in the prior art semiconductor photo-sensors.

It is another object of the present invention to provide a semiconductor photo-sensor sealed by light transmitting resin in which electrical signals derived from a plurality of photo-sensing cells of a photo-electric conversion element are equal.

It is another object of the present invention to provide a semiconductor photo-sensor sealed by light transmitting resin in which an electrical signal from a photo-sensing cell is not attenuated even if there is a defect on a surface of the light transmitting resin.

It is a further object of the present invention to provide a method for manufacturing a semiconductor photo-sensor sealed by light transmitting resin and having a light transmitting member such as an optical filter mounted on a light transmission surface of the sealant, which allows a good optical characteristic between the sealant and the light transmitting member, and high manufacturing yield and low manufacturing cost.

In order to achieve the above objects, the semiconductor photo-sensor of the present invention has a thickness between a transparent area through which light is directed to the photo-conversion element having a plurality of photo-sensing cells and a photo-sensing surface of the photo-electric conversion element and a shape of the transparent area which are so designed that effects of a light reflected by a photo-sensing cell of the photo-electric conversion element, further reflected by the transparent area and then directed to other photo-sensing cells, and a light reflected by a periphery of the photo-sensing cells of the photo-electric conversion element, further reflected by the transparent area and then directed to the photo-sensing cells, are reduced.

In accordance with the present invention, the method for manufacturing the semiconductor photo-sensor comprises the steps of:

mounting a light transmitting member at a predetermined position on a mold;

holding a semiconductor photo-sensor element comprising a photo-electric conversion element, electrical connection means and lead terminals excluding external leads, in facing relation to the light transmitting member;

injecting light transmitting resin into the mold to seal the semiconductor sensor element and bonding the light transmitting member by the sealant.

DETAILED DESCRIPTION OF THE PREFERRED EMBODIMENTS

Figure 1:
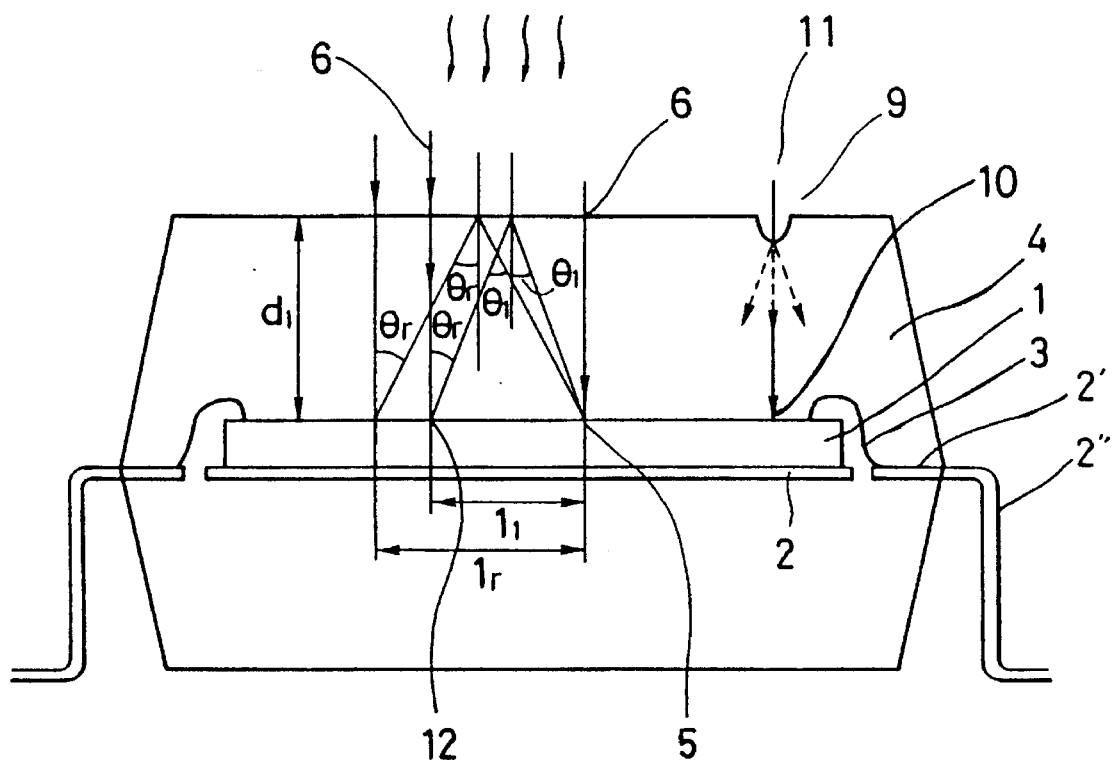
FIG. 1 shows a sectional view of a prior art semiconductor photo-sensor.

Referring to FIG. 1, causes for the problems encountered in the prior art photo-sensors, which the inventors studied, are explained.

When light 6 impinges at right angle to the light transmitting resin 4 and the photo-electric conversion element 1 through an air layer 11, the light is reflected and scattered by a surface 12 of the photo-electric conversion element 1. An intensity of the reflected and scattered light is dependent on an angle depending on material and area of the surface 12. Some of the reflected and scattered lights reach the air layer 11 through the resin 4 and some are reflected at the interface of the air layer 11 and the resin 4.

According to Snell's law, a total reflection occurs at a certain angle $\theta_1$ which is determined by indices of refraction of the light transmitting resin 4 and the air layer 11. For example, when the indices of refraction of the light transmitting resin 4 and air layer 11 are 1.5 and 1, respectively, the angle $\theta_1$ is approximately 40 degrees and the total reflection occurs when the incident angle is more than 40 degrees. An incident light intensity A at the photo-sensing cell 5 of the photo-electric conversion element 1 is given by A=[intensity of light 6]+[integration of all reflected lights of lights having an incident angle $\theta_r$ ($\theta_r \geq \theta_1$)]+[integration of all reflected lights of lights having an incident angle $\theta_r$ ($\theta_r < \theta_1$)]  (1)

In the third term of the formula (1), when $\theta_r$ is smaller than $\theta_1$, a reflected light is of very low intensity and it may be neglected, but when $\theta_r$ is close to $\theta_1$, the reflected light intensity is high.

For example, in the AF sensor, a light shielding Al film and a passivation film are laminated on an area other than a photo-sensing area. Since the Al film has a certain surface roughness, an incident light is diffusion-reflected by the Al film. In the AF sensor, the incident light is not always directed normally to the photo-sensing area but directed at an angle. In such a case, the lights which are reflected at an angle close to the total reflection angle increase.

The inventors made the following theoretical assumption. The intensity of the light to the photo-sensing cell 5 is a sum of the light intensity of the light 6 and light intensities of lights reflected by a vicinity of circumference and outside of a circle centered at the photo-sensing cell 5 on the photo-electric conversion element 1 and having a radius $l_1$. The latter spurious reflected lights cause abnormality in the optical characteristic.

The inventors further studied based on the above assumption and attained an excellent result in a semiconductor photo-sensor constructed in accordance with the requirement of the theoretical assumption.

Figure 2:
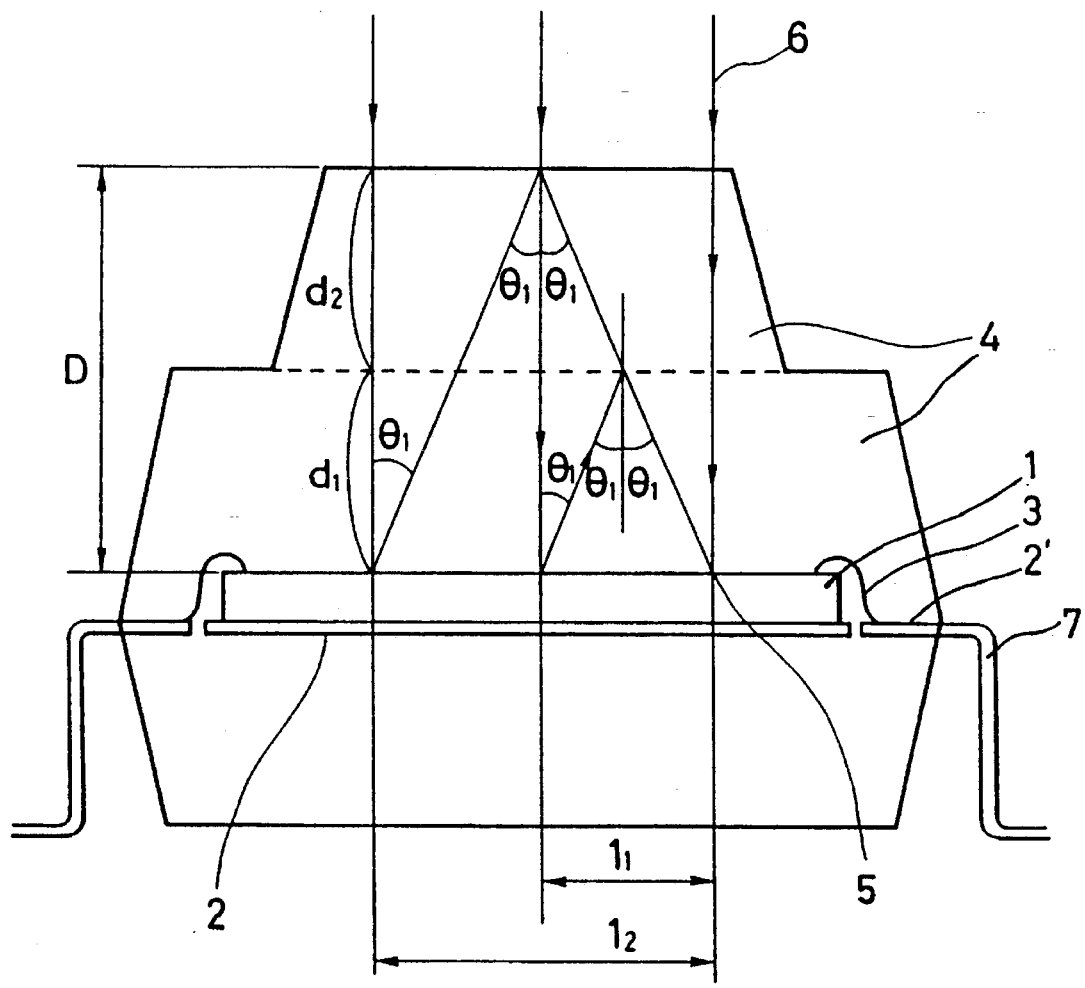
FIG. 2 shows a sectional view of one embodiment of a semiconductor photo-sensor of the present invention.

FIG. 2 shows a sectional view of a first embodiment of the semiconductor photo-sensor of the present invention. In FIG. 2, the like numerals to those shown in FIG. 1 designate the like elements. The photo-electric conversion element 1 is fixed to the photo-electric element support member 2, fine metal wires 3 are bonded to predetermined areas of the photo-conversion element 1 and the lead terminals 2', and the light transmitting resin 4 is molded by mold means such as transfer mold method to form an outer shape. The mold used has a larger distance between the light transmitting surface and the photo-electric conversion element than that of the prior art photo-sensor. In FIG. 2, $d_1$ represents a distance between the sealant surface and the photo-electric conversion element 1 of the prior art semiconductor photo-sensor, and $d_1+d_2$ represents a distance between the light transmitting surface of the sealant and the photo-electric conversion element 1 of the present invention. In the prior art photo-sensor, $D=d_1$ while in the present invention, $D=d_1+d_2$ ($d_2>0$). Then, the external leads 7 of the lead terminals 2' are cut to a desired length and bent to complete the semiconductor photo-sensor.

The intensity of light applied to the photo-sensing element 5 of the photo-electric conversion element 1 is given by the following formula, where $\theta$ is a total reflection angle by the Snell's law.

A=(an intensity of the light 6)+(sum of intensities of lights in the vicinity of circumference and outside of circle having the radius $l_1$ on the photo-sensitive conversion element 1)  (2)

On the other hand, the light intensity in the semiconductor photo-sensor of the present invention is given by the following formula, where $d_2 \neq 0$.

A=(an intensity of the light 6)+(sum of intensities of lights reflected by the vicinity of circumference and outside of the circle having a radius $l_2$ on the photo-electric conversion element 1)  (3)

In the formula (3), $l_1 = 2d_1 \tan \theta_1$ $l_2 = 2(d_1+d_2) \tan \theta_1$ $l_2 - l_1 = 2d_2 \tan \theta_1$ ($\theta_1$ and $l_1$ are constant)

Accordingly, the larger $d_2$ is, the larger is the difference $l_2-l_1$, the smaller is the area to which the reflected light is applied and the smaller is the affect by the reflection. Since the light intensity is inversely proportional to square of light path length, the absolute value of intensity of the reflected light in the present invention is reduced because the light path length is long, and hence the affect is reduced. In order to reduce the effect by the reflected light, the area other than the photo-sensing area of the photo-electric conversion element 1 is masked to block the light in order to reduce the affect of the reflected light from the other than photo-sensing area, and $d_2$ and the shape of the light transmitting surface of the sealant are so designed that the photo-sensing cells of the photo-electric conversion element 1 are within the circle having the radius $l_2$. If the light impinges on an area other than the photo-sensing area of the photo-electric conversion element 1 even with the masking, or if the photo-sensing cell must be located outside the circle having the radius $l_2$, the degree of affect is predicted and $d_2$ and the shape of the light transmitting surface of the sealant are designed to minimize the affect.

The semiconductor photo-sensor of the present invention is effective to a sensor which is highly sensitive to reflection such as line sensor or area sensor in which the photo-electric conversion element comprises a number of photo sensing cells such as CCD's.

Figure 3:
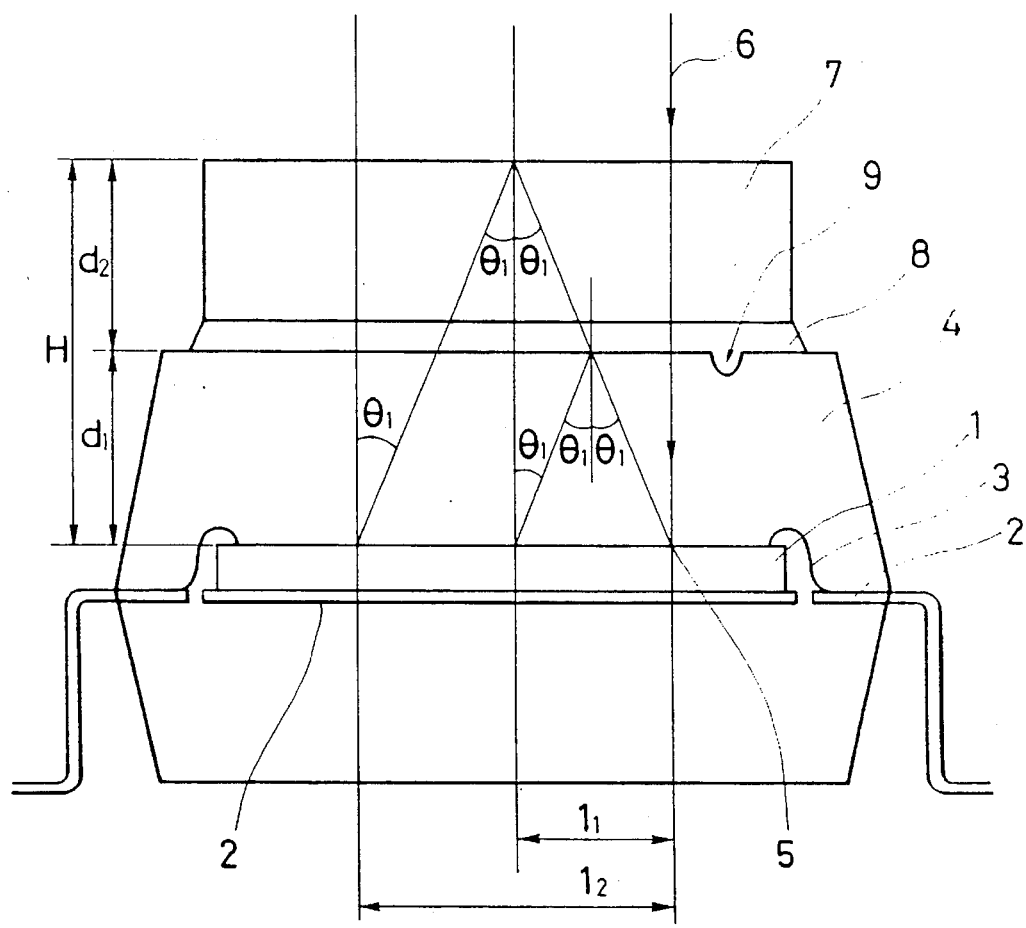
FIG. 3 shows a sectional view of another embodiment of the semiconductor photo-sensor of the present invention.

FIG. 3 shows a sectional view of a second embodiment of the semiconductor photo-sensor of the present invention. In FIG. 3, the like numerals to those shown in FIG. 2 designate the like elements.

In the present embodiment, the bulky portion ($d_2$) is made of glass instead of light transmitting resin used in FIG. 1.

A semiconductor photo-sensor having a filter made of infrared blocking glass arranged on the light transmitting surface of the light transmitting resin has been known. However, such a photo-sensor has a different object than that of the present invention and the photo-electric conversion element thereof has only one photo-sensing cell. Accordingly, the problem addressed by the present invention has not been an issue in the prior art photo-sensor.

In FIG. 3, a bonding layer 8 bonds the sealant 4 to the glass 7 and is made of light transmitting resin. The light transmitting resin used for the bonding layer may be or may not be same as that of the sealant 4. When they are same, the glass 7 is formed simultaneously when the light transmitting resin 4 is formed by the transfer mold method and the glass 7 may be bonded and held by the light transmitting resin 4 itself.

The thickness and shape of the glass 7 are determined by the same conditions as those imposed on the bulky portion of the first embodiment. In the present embodiment, in addition to the effect of the first embodiment, the effect on the optical characteristic is reduced because the defect on the surface 9 of the light transmitting resin 4 is filled by the light transmitting resin 8 having the substantially same index of refraction as that of the light transmitting resin 4, or the defect is not formed on the surface since the glass 7 is bonded and held by the light transmitting resin 4.

Figure 4:
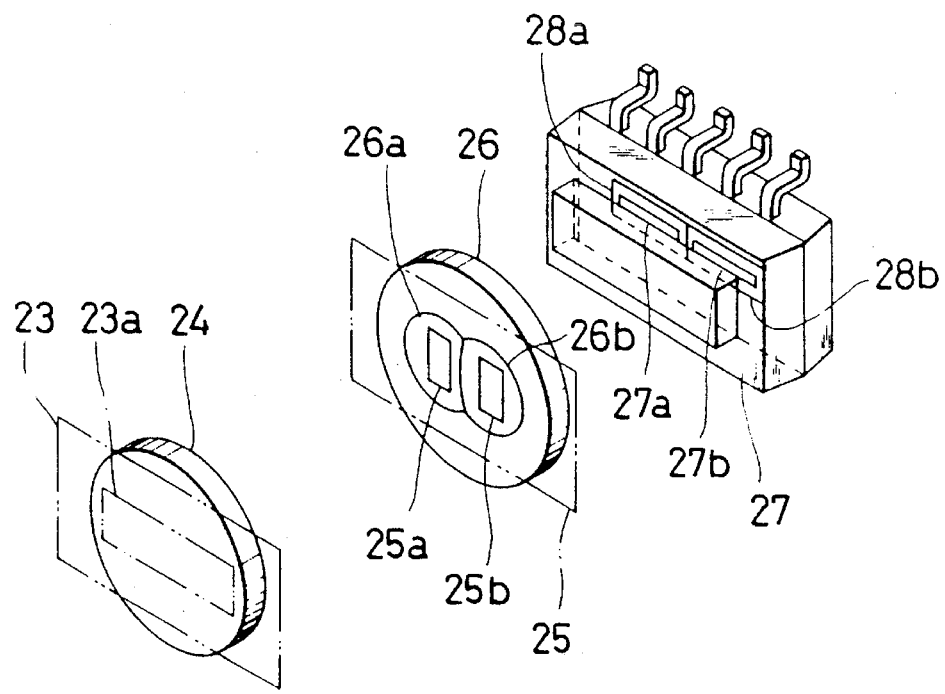
FIG. 4 shows an optical system developed diagram of the semiconductor photo-sensor of the present invention used as an AF sensor of a camera.

FIG. 4 shows an optical system developed diagram when the semiconductor photo-sensor of the present invention is used as an AF sensor of a camera. Numerals 23–28 denote parts of a focus detection unit (AFU). Numeral 23 denotes a view field mask arranged near a focus plane, numeral 24 denotes a field lens, numeral 25 denotes a focusing beam splitting mask having apertures 25a and 25b, numeral 26 denotes a secondary focusing lens and numeral 26a and 26b denotes lens areas. Numeral 27 denotes a focus sensor (semiconductor photo-sensor of the present invention) having a pair of line sensors 27a and 27b each having a number of pixels linearly arranged.

Numerals 28a and 28b denote images of 23a projected by the lens areas 26a and 26b of the secondary focusing lens 26. A dimension of the aperture 25a is so designed that the edges of the images 28a and 28b are closely adjacent to each other. Numeral 24 denotes a lens for directing the light beam to the focusing light beam splitting mask 25 and the secondary focusing lens 26.

In the present optical system, the light beam which passed through the imaging lens is focused on 23, passes through the apertures 25a and 25b and refocused into 28a and 28b on the line sensors 27a and 27b by the lens areas 26a and 26b, respectively. By detecting a relative position of two images on the line sensors 27a and 27b, an in-focus state is checked.

Figure 5:
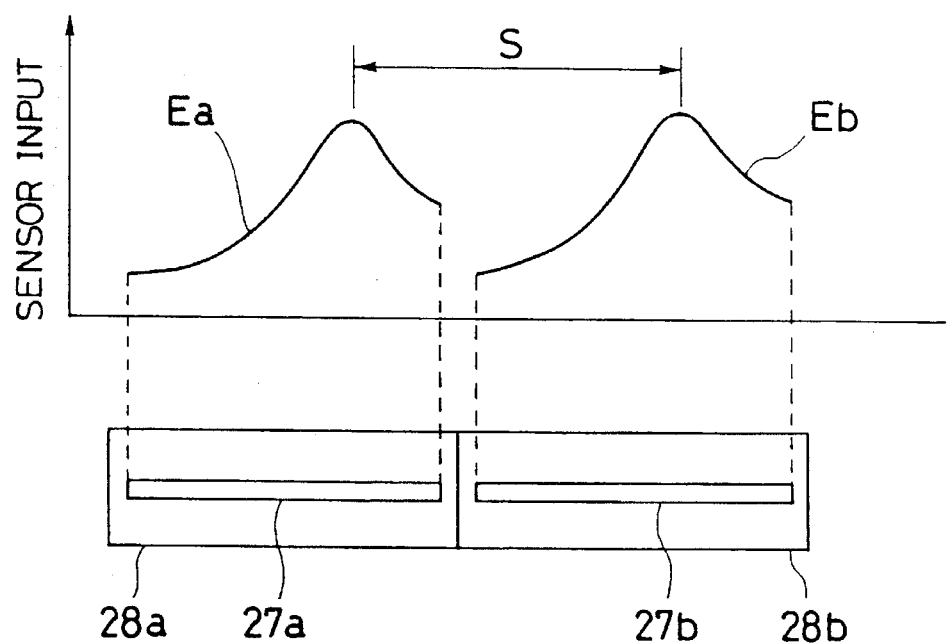
FIG. 5 illustrates a principle thereof.

FIG. 5 illustrates a principle thereof. Ea and Eb denote outputs of the images projected on the line sensors 27a and 27b, respectively. In the in-focus state, a distance S between the two images assumes $S_0$. If the imaging lens is not in the in-focus state, $S \neq S_0$. In order to detect it, Ea and Eb are relatively bit-shifted to correlate the two images.

If the reflection of the image on 28a affects to the reflection of the image on 28a, the reflection of the image on 28b affects to the reflection of the image on 28b, the reflection of the image on 28a affects to the reflection of the image on 28b or the reflection of the image on 28b affects to the reflection of the image on 28a, then Ea and Eb are of different shapes than those of true object brightness distribution and the correlation is carried out with different information than the true object information. As a result, focus information detected includes an error.

The semiconductor photo-sensor of the present invention reduces the effect of reflection and provides correct focus information. Accordingly, it reverses an existing theory that the "clear mold is not applicable to the Af sensor."

A manufacturing method for the semiconductor photo-sensor of the present invention is now explained.

In FIGS. 6 to 11, the like numerals to those shown in FIGS. 1 to 3 designates the like elements.

Figure 6:
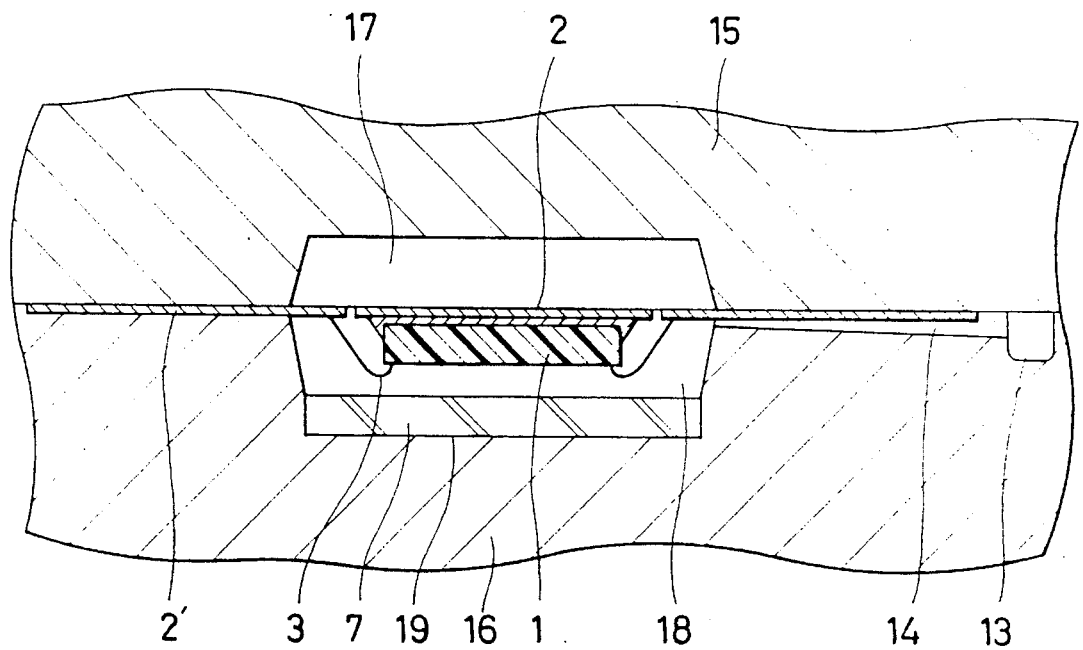
FIGS. 6 to 11 show sectional views of embodiments of a manufacturing method for the semiconductor photo-sensor of the present invention.

Referring to FIG. 6, a first embodiment of the manufacturing method of the present invention is explained.

(1) The photo-electric conversion element 1 for converting a light to an electrical signal is fixed by bonding material to a bottom surface of the lead frame element mount 2.

(2) The lead frame element mount 2 and the photo-electric conversion element 1 are electrically connected by fine metal wires 3. By the steps (1) and (2), a major portion of the semiconductor photo-sensor is formed.

(3) The glass 7 is inserted into a recess 19 formed in a cavity of a lower mold 16.

(4) The major portion of the semiconductor photo-sensor formed in the steps (1) and (2) is arranged in the lower mold 16 at a position facing the glass 7, and an upper mold 15 is closed.

(5) The light transmitting resin 4 is injected from a runner 13 and a gate 14 into the upper mold cavity 17 and the lower mold cavity 18.

(6) Heat is applied to the upper mold 15 and the lower mold 16 to seal the main portion of the semiconductor photo-sensor by the injected light transmitting resin 4.

(7) The upper mold 15 and the lower mold 16 are removed.

(8) The exposed areas of the lead frame leads 2 are plated.

(9) Unnecessary portions of the lead frame leads are cut away.

(10) External leads are bent.

Through those steps, the semiconductor photo-sensor shown in FIG. 2 is completed.

In accordance with the first embodiment of the present invention, the bonding material is not used and the light transmitting resin and the optical filter are paired. Accordingly, the following advantages are offerred.

(1) The number of steps is reduced.

(2) The light transmitting resin 4 injected into the cavity 18 is stacked on the prearranged optical filter 7. Accordingly, the surface of the light transmitting resin which serves as the light path contacts to the glass 7 and it is not molded by the mold. Accordingly, the deterioration of the light transmissivity due to the mold releasing agent deposited during molding or the crack created by the transfer is prevented.

(8) Since the glass 7 is arranged in the lower mold 16, no special position detector is required and the positioning precision is improved. Vertical, longitudinal and lateral position can be determined freely by appropriately selecting the shape of mold.

(4) Since no bonding layer exists in the light path, the degradation of the light transmissivity due to the generation of air bubble in the bonding material is prevented.

(5) Since the light transmitting member such as lens is used, the light transmitting resin and the lens can be released at an acute angle even if an acute area is formed in the light transmitting resin. Accordingly, the cracking when the mold is released is prevented.

Figure 7:
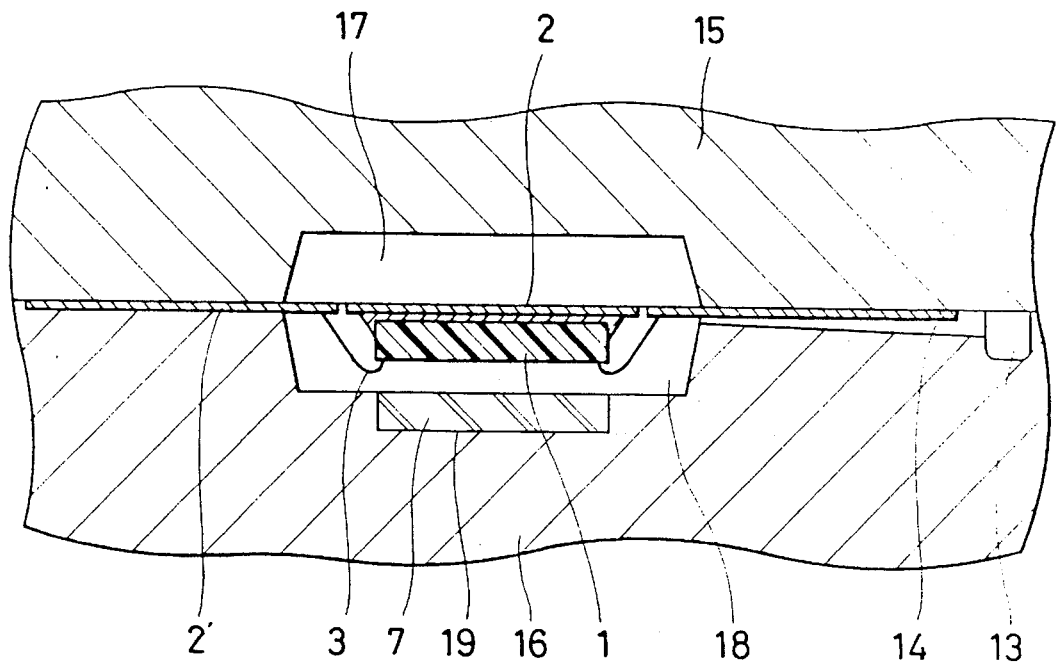

FIG. 7 shows a sectional view of a second embodiment of the present invention.

In the present embodiment, since a recess 19 is formed in the lower mold 16, the glass 7 is positioned by the recess 19 even if the glass 7 is smaller than the light transmitting resin light path surface. Accordingly, the position of the glass 7 in the final product is very accurate.

Figure 8:
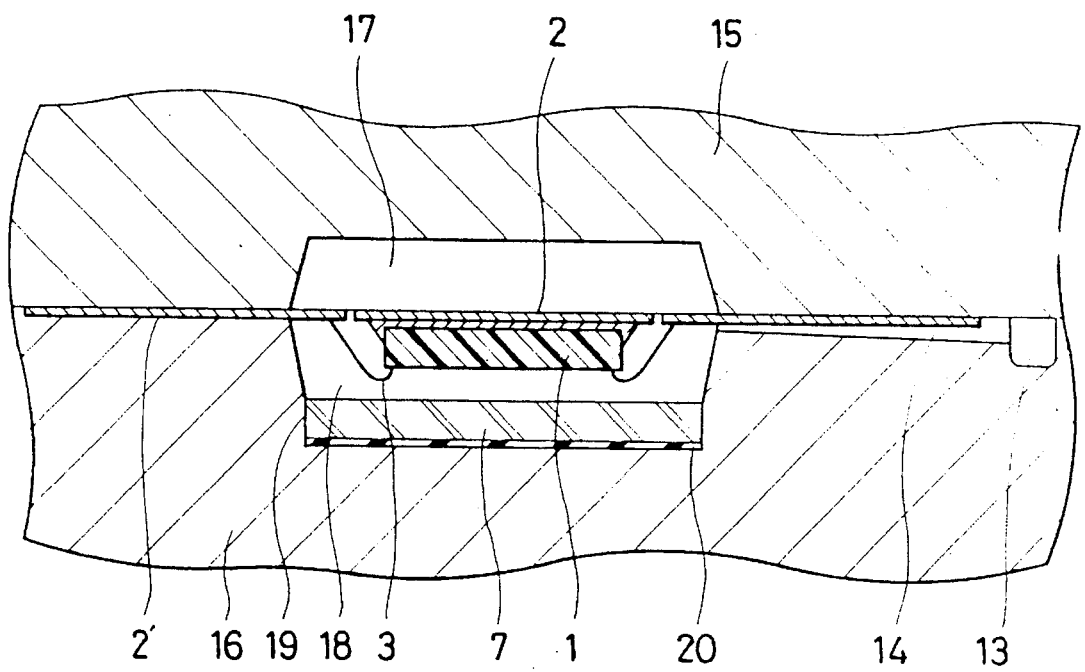

FIG. 8 shows a sectional view of a third embodiment of the present invention. In accordance with the present embodiment, silicone grease is applied to the bottom of the recess 19 and the glass 7 is mounted thereon. Accordingly, the resin does not penetrate into the interface between lower mold 16 and the glass 7.

The sealing method in the present invention may be casting mold, transfer mold or injection mold. Depending on the manufacturing condition the resin may penerate into the space between the glass 7 and the recess 19 of the lower type 16. The resin so penerated deposit thinnly on the glass 7 and the light transmissivity is impeded by the diffused reflection. The third embodiment shown in FIG. 8 is particularly effective to prevent the above problem.

Figure 9:
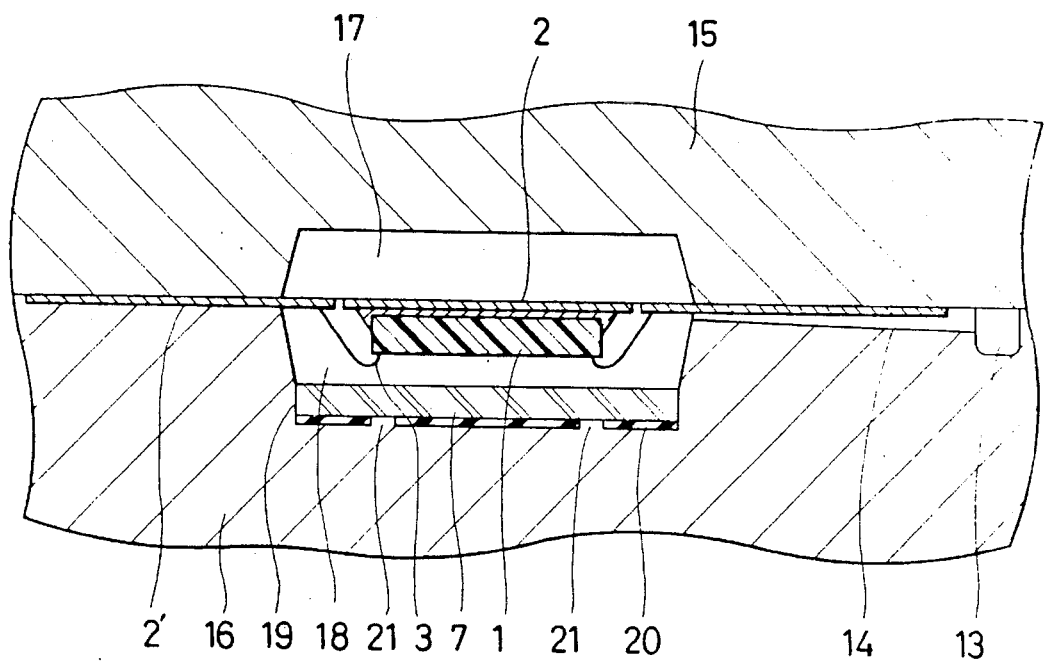

FIG. 9 shows a sectional view of a fourth embodiment of the present invention.

In the present embodiment, a projection 21 is formed on the bottom of the lower mold 16 so that the glass 7 is held by the projection 21. Accordingly, the vertical position of the glass 7 is defined even if silicone grease 20 is used.

In the fourth embodiment, since the glass 7 is held by the viscosity of the silicone grease 20, the optical filter 7 does not drop even if the glass 7 is mounted on the upper mold 15.

In the third and fourth embodiments, silicone grease is used. Alternatively, other viscous material such as wax such as carnoubarrow, oil such as silicone oil or grease other than silicon grease.

Figure 10:
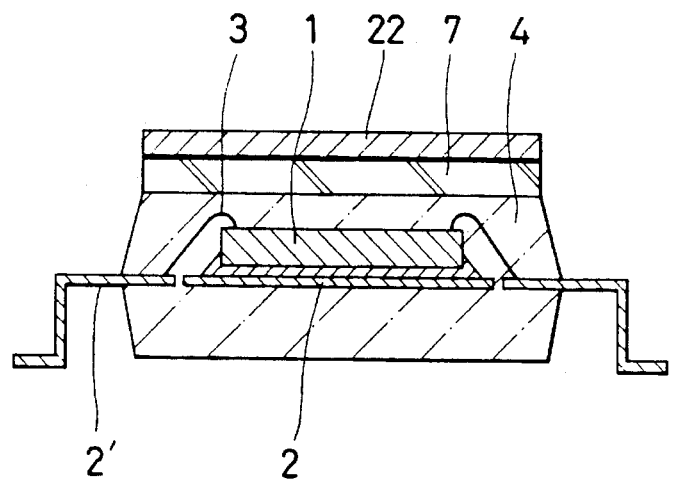
Figure 11:
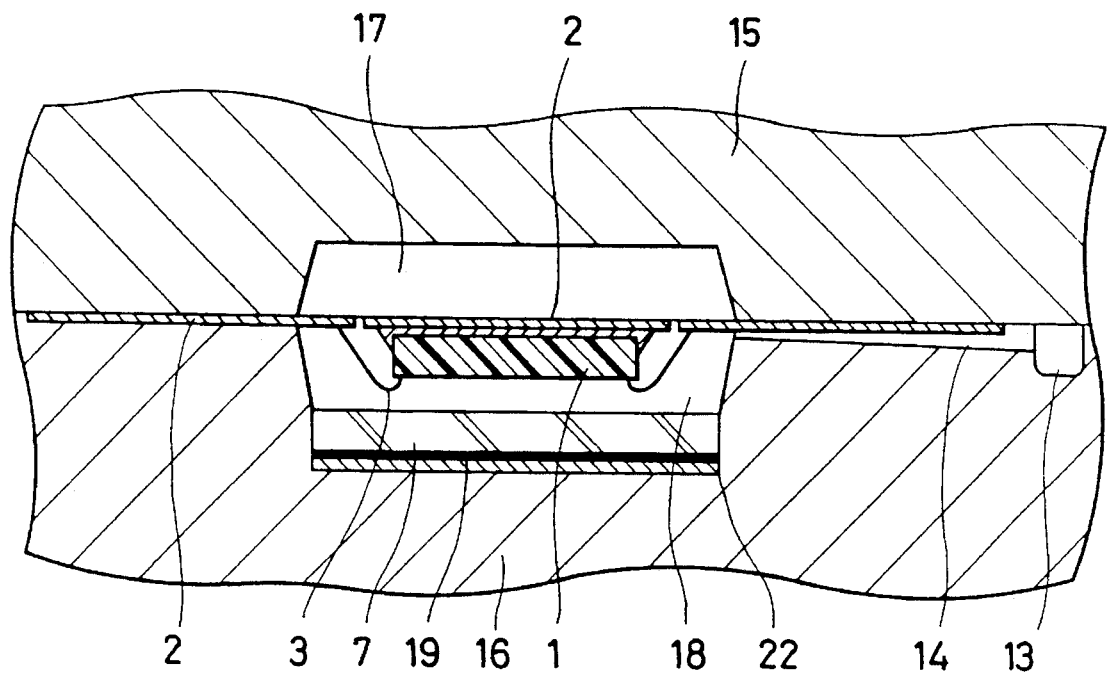
Figure 12:
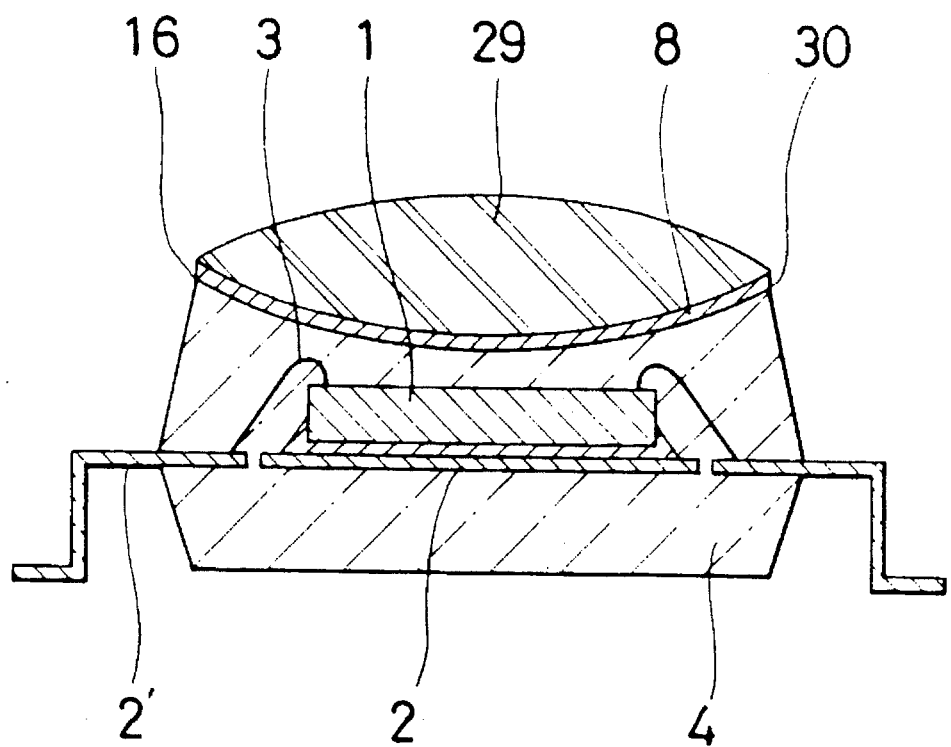
FIG. 12 shows a semiconductor photo-sensor with a lens filter.

FIGS. 10 and 11 show a fifth embodiment. In the present embodiment, an adhesive tape 22 is applied to one surface (facing the lower mold 16) of the glass 7 formed in the step (3) of the first embodiment. Namely, the adhesive tape 22 is arranged in the interface between the glass and the lower mold 12.

The adhesive tape 22 is removed from the glass 7 after the step (7) of the first embodiment. Other steps are identical to those of the first embodiment.

By applying the adhesive tape 22, flakes created by the penetration of the resin into the interface between the glass 7 and the lower mold 16 are removed when the adhesive tape 22 is peeled off the glass 7.

The adhesive tape should have a heat resistivity (to withstand a temperature of approximately 150° C. applied when the resin is molded or heated) and there is no restriction so long as it has such heat resistivity. The adhesive material of the adhesive tape may be epoxy resin, epoxy phenol resin (which has a heat resistivity of up to 180° C. for continuous heating), vinyl chloride resin, polyimide or polyamide-imide.

In the present invention, the material of the photo-electrical conversion element, the division of the photo-sensing surface and the circuit may be selected from various alternatives depending on the application and purpose of the semiconductor photo-sensor. One application is an image pick-up, plane-divided silicon photo-electric conversion element. While the glass and lens are used as the light transmitting member on the light transmitting resin in the above embodiments, optical filter, polarization plate or concave lens may be used depending on the application and purpose of the semiconductor photo-sensor.

In the present invention, the light transmitting resin is selected in accordance with the application and object of the semiconductor photo-sensor and it should be light transmissive and adhesive as well as resistive to heat and water.

For example, when an operable wavelength range of the semiconductor photo-sensor is a visible light range of 300 μm to 1000 μm and the material of the light transmitting member is glass, the resin is preferably hardened acid anhydride of bis-phenol type A epoxy resin from the standpoints of light transmissivity, adhesivity and reliability.

In accordance with the manufacturing method for the semiconductor photo-sensor of the present invention, the light transmitting resin is not affected by the mold or the mold releasing agent, and the resin seal having an excellent light transmissivity is attained, and the optical characteristic of the semiconductor photo-sensitive material is significantly improved. The positioning of the light transmitting member to the light transmitting resin is facilitated, the total number of steps is reduced and the manufacturing cost is reduced. Further, even if a lens or other non-planar member is used as the light transmitting material, a crack is not created when the mold is released.

We claim:

1. A method for manufacturing a semiconductor photo-sensor comprising the steps of:

providing within a cavity, an assembly comprising (1) a photoelectric conversion element having a photoreceiving section, and (2) a lead terminal having an inner lead connected to the photoelectric conversion element by a bonding wire;

providing a light transmitting member within the cavity spaced apart from the photoelectric conversion element and at a light-incident side of the photoelectric conversion element, the light transmitting member having an inner surface facing an upper surface of the photoelectric conversion element and an outer surface opposite the inner surface; and sealing the photoelectric conversion element, the inner lead of the lead terminal and the bonding wire by introducing a light transmitting resin into the cavity and in the space between the photoelectric conversion element and the light transmitting member so as to provide a relation:

$$l < 2 \cdot (d_1 + d_2) \cdot \tan\theta_1,$$

wherein l is a length of the photoreceiving section of the photoelectric conversion element, $d_1$ is a thickness of the light transmitting resin above the upper surface of the photoelectric conversion element, $d_2$ is a thickness of the light transmitting member, and $\theta_1$ is a total reflection angle of the outer surface of the light transmitting member.

2. A method for manufacturing a semiconductor photosensor according to claim 1, wherein said sealing step provides another relation:

$$l > 2 \cdot d_1 \cdot \tan\theta_1.$$

3. A method for manufacturing a semiconductor photosensor according to claim 1, wherein the light transmitting member is provided in the cavity in a recess formed at the bottom of a mold.

4. A method for manufacturing a semiconductor photosensor according to claim 3, wherein the light transmitting member is provided in the recess with adhesive material interleaved therebetween.

5. A method for manufacturing the semoconductor photosensor according to claim 4 wherein said adhesive material is carnoubarrow.

6. A method for manufacturing the semiconductor photosensor according to claim 4 wherein said adhesive material is silicone oil.

7. A method for manufacturing the semiconductor photosensor according to claim 4 wherein said adhesive material is silicone grease.

* * * * *

UNITED STATES PATENT AND TRADEMARK OFFICE
CERTIFICATE OF CORRECTION

PATENT NO. : 5,583,076

DATED : December 10, 1996

INVENTOR(S): TETSUO YOSHIZAWA, ET AL.

Page 1 of 3

It is certified that error appears in the above-identified patent and that said Letters Patent is hereby corrected as shown below:

COLUMN 2

```
Line 9, "process" should read --processes--.
Line 10, "is a cause to" should read --cause an-- and
    "a" (last occurrence) should read --in--.
Line 17, "investiment" should read --investment--.
Line 21, "must" should read --must be--.
```

COLUMN 3

```
Line 39, "angle" should read --angles--.
```

COLUMN 4

```
Line 42, "the" should be deleted.
```

COLUMN 5

```
Line 3, "affect" should read --effect--.
Line 7, "affect" should read --effect--.
Line 11, "affect" should read --effect--.
Line 19, "affect" should read --effect--.
```

UNITED STATES PATENT AND TRADEMARK OFFICE
CERTIFICATE OF CORRECTION

PATENT NO.   : 5,583,076

DATED        : December 10, 1996

INVENTOR(S)  : TETSUO YOSHIZAWA, ET AL.

It is certified that error appears in the above-identified patent and that said Letters Patent is hereby corrected as shown below:

COLUMN 5

Line 21, "affect" should read --effect--.
Line 23, "to" (first occurrence) should read --with--.
Line 24, "as" should read --as a--.
Line 25, "photo sensing" should read --photo-sensing--.
Line 66, "numeral" should read --numerals--.
Line 67, "denotes" (first occurrence) should read --denote--.

COLUMN 6

Line 23, "affects to" should read --affect--.
Line 25, "affects to" should read --affect--.
Line 26, "affects to" should read --affect--.
Line 27-28, "affects to" should read --affect--.
Line 40, "designates" should read --designate--.

COLUMN 7

Line 40, "penerate" should read --penetrate--.
Line 42, "penerated deposit thinnly" should read --penetrated deposits thinly--.
Line 56, "used. Alternatively," should read --used; alternatively,--.

UNITED STATES PATENT AND TRADEMARK OFFICE
CERTIFICATE OF CORRECTION

PATENT NO. : 5,583,076

DATED : December 10, 1996

INVENTOR(S) : TETSUO YOSHIZAWA, ET AL.

It is certified that error appears in the above-identified patent and that said Letters Patent is hereby corrected as shown below:

<u>COLUMN 10</u>

Line 5, "semoconductor" should read --semiconductor--.

Signed and Sealed this

Twenty-ninth Day of July, 1997

Attest:

BRUCE LEHMAN

*Attesting Officer*     *Commissioner of Patents and Trademarks*